(12) United States Patent
Mickley et al.

(10) Patent No.: US 8,430,059 B2
(45) Date of Patent: Apr. 30, 2013

(54) PRECISION PEN HEIGHT CONTROL FOR MICRO-SCALE DIRECT WRITING TECHNOLOGY

(75) Inventors: Timothy J. Mickley, Elk River, MN (US); Frank Genovese, Longboat Key, FL (US); James Feng, Maple Grove, MN (US); Leonard B. Richardson, Brooklyn Park, MN (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 1358 days.

(21) Appl. No.: 12/137,235

(22) Filed: Jun. 11, 2008

(65) Prior Publication Data

US 2009/0312878 A1  Dec. 17, 2009

(51) Int. Cl.
*B05C 11/00*  (2006.01)
*G01D 15/16*  (2006.01)

(52) U.S. Cl.
USPC ............ 118/663; 118/697; 118/401; 118/410

(58) Field of Classification Search .................. 118/663, 118/697, 401, 410
See application file for complete search history.

(56) References Cited

U.S. PATENT DOCUMENTS

| | | | |
|---|---|---|---|
| 4,485,387 A * | 11/1984 | Drumheller | 118/401 |
| 4,571,080 A | 2/1986 | Papuchon et al. | |
| 4,575,246 A | 3/1986 | Nishizawa et al. | |
| 4,621,926 A | 11/1986 | Merry et al. | |
| 5,012,090 A * | 4/1991 | Spillman, Jr. | 250/237 G |
| 5,341,207 A | 8/1994 | Tank et al. | |
| 6,100,609 A | 8/2000 | Weber | |
| 7,045,015 B2 * | 5/2006 | Renn et al. | 118/686 |

FOREIGN PATENT DOCUMENTS

GB    1124782    8/1968

* cited by examiner

*Primary Examiner* — Marianne L Padgett
*Assistant Examiner* — Stephen Kitt
(74) *Attorney, Agent, or Firm* — Vidas, Arrett & Steinkraus (57) ABSTRACT

An apparatus for precision pen height control which includes a dispensing member, a fluid dispensing system, a vertical position sensing system, and a vertical position controller. The fluid dispensing system is in fluid communication with an opening in the dispensing member via a tubular member. A vertical position sensing system, which includes a diffraction grating and a sensor, is engaged to the tubular member. The sensor is positioned adjacent the diffraction grating. The diffraction grating is engaged to a vertical support, which is engaged to the tubular member. The sensor produces a vertical position signal based upon the position of the vertical support. The vertical position controller is engaged to the vertical position sensing system, and receives a control signal generated from the vertical position signal. The vertical position controller produces and applies vertical forces to the vertical support in response to the control signal.

14 Claims, 8 Drawing Sheets

PRECISION PEN HEIGHT CONTROL FOR MICRO-SCALE DIRECT WRITING TECHNOLOGY

CROSS-REFERENCE TO RELATED APPLICATIONS

Not Applicable

STATEMENT REGARDING FEDERALLY SPONSORED RESEARCH

Not Applicable

BACKGROUND OF THE INVENTION

1. Field of the Invention

The present invention relates to direct writing technology at a micro-scale level. In particular, the invention is directed towards a fluid dispensing system which applies micro-scale patterns on surfaces of medical devices.

2. Description of the Related Art

Direct-write technology with a dynamic fluid dispensing system has been successfully used for precision material placement in manufacturing a variety of products. Utilizing a two-axis positioning system, it has demonstrated capabilities for drawing lines and serpentine traces with width less than 50 microns on a wide range of substrates with and without complicated topologies Almost any material can be dispensed, including thick-film cermet pastes for the high voltage resistor industry.

A key feature of the process is the "soft-contact" control of the pen tip that delivers the material directly to the target substrate. The pen is suspended at an optimum height by optically sensing its position and dynamically applying correction forces to the pen tip. When properly adjusted, the pen can float on the substrate surface, passing over previously deposited traces and asperities with near-zero contact force, being held aloft by a combination of capillary pressure and hydrodynamic pressure developed in the flowing liquid "ink" between the pen tip and substrate.

Current direct-write technology, such as in U.S. Pat. No. 4,485,387 to Drumheller, the entire contents of which being incorporated herein by reference, is limited by its available pen-tip height control mechanism. Thus, a need exists for a new design of pen-tip force control to allow for finer scale resolutions.

The art referred to and/or described above is not intended to constitute an admission that any patent, publication or other information referred to herein is "prior art" with respect to this invention In addition, this section should not be construed to mean that a search has been made or that no other pertinent information as defined in 37 C.F.R. §156(a) exists.

All U.S. patents and applications and all other published documents mentioned anywhere in this application are incorporated herein by reference in their entirety.

Without limiting the scope of the invention a brief summary of some of the claimed embodiments of the invention is set forth below. Additional details of the summarized embodiments of the invention and/or additional embodiments of the invention may be found in the Detailed Description of the Invention below.

A brief abstract of the technical disclosure in the specification is provided for the purposes of complying with 37 C.F.R. §1.72

BRIEF SUMMARY OF THE INVENTION

In some embodiments, the present invention is directed towards an apparatus for precision pen height control. In at least one embodiment, the apparatus comprises a dispensing member, a fluid dispensing system, a vertical position sensing system, and a vertical position controller. A portion of the dispensing member defines an opening. The fluid dispensing system is in fluid communication with the opening by a tubular member. The vertical position sensing system is fixedly engaged to the tubular member and comprises a diffraction grating and a sensor. The sensor is positioned adjacent the diffraction grating and the sensor is constructed and arranged to sense the diffraction grating. A vertical support is engaged to the tubular member. The sensor is further constructed and arranged to produce a vertical position signal based upon the position of the vertical support. The vertical position controller is engaged to the vertical position sensing system and is constructed and arranged to receive a control signal generated at least partially from the vertical position signal. The vertical position controller is constructed and arranged to produce and apply vertical forces to the vertical support in response to the control signal.

In some embodiments, the diffraction grating is engaged to the vertical support.

In at least one embodiment, the sensor is an optical grating sensor.

In some embodiments, the vertical position controller is a linear actuator.

In at least one embodiment, the linear actuator is a voice coil motor.

In some embodiments, the apparatus comprises a dispensing member, a reflective surface, a fluid dispensing system, a vertical position sensing system, and a vertical position controller. A portion of the dispensing member defines an opening. The reflective surface is engaged to the dispensing member. The fluid dispensing system is in fluid communication with the opening by a tubular member. The vertical position sensing system is fixedly engaged to the tubular member and comprises an interferometer. The vertical position sensing system is constructed and arranged to produce a vertical position signal based upon the position of the reflective surface. The vertical position controller is engaged to the vertical position sensing system. The vertical position controller is constructed and arranged to receive a control signal generated at least partially from the vertical position signal. The vertical position controller is further constructed and arranged to produce and apply vertical forces to the vertical support in response to the control signal.

In at least one embodiment, the present invention is directed towards a method of controlling pen height. In some embodiments, the method comprises providing a dispensing member, providing a fluid dispensing system, providing a vertical position sensing system, and providing a vertical position controller. A portion of the dispensing member defines an opening. The fluid dispensing system is in fluid communication with the opening by a tubular member. The vertical position sensing system is fixedly engaged to the tubular member and comprises a diffraction grating and a sensor. The sensor is positioned adjacent the diffraction grating and the sensor is constructed and arranged to sense the diffraction grating. A vertical support is engaged to the tubular member. The sensor is further constructed and arranged to produce a vertical position signal based upon the position of the vertical support. The vertical position controller is engaged to the vertical position sensing system and is constructed and arranged to receive a control signal generated at least partially from the vertical position signal. The vertical position controller is constructed and arranged to produce and apply vertical forces to the vertical support in response to the control signal.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

BRIEF DESCRIPTION OF THE SEVERAL VIEWS OF THE DRAWING(S)

A detailed description of the invention is hereafter described with specific reference being made to the drawings.

DETAILED DESCRIPTION OF THE INVENTION

While this invention may be embodied in many different forms, there are described in detail herein specific preferred embodiments of the invention. This description is an exemplification of the principles of the invention and is not intended to limit the invention to the particular embodiments illustrated.

For the purposes of this disclosure, like reference numerals in the figures shall refer to like features unless otherwise indicated.

Figure 1:
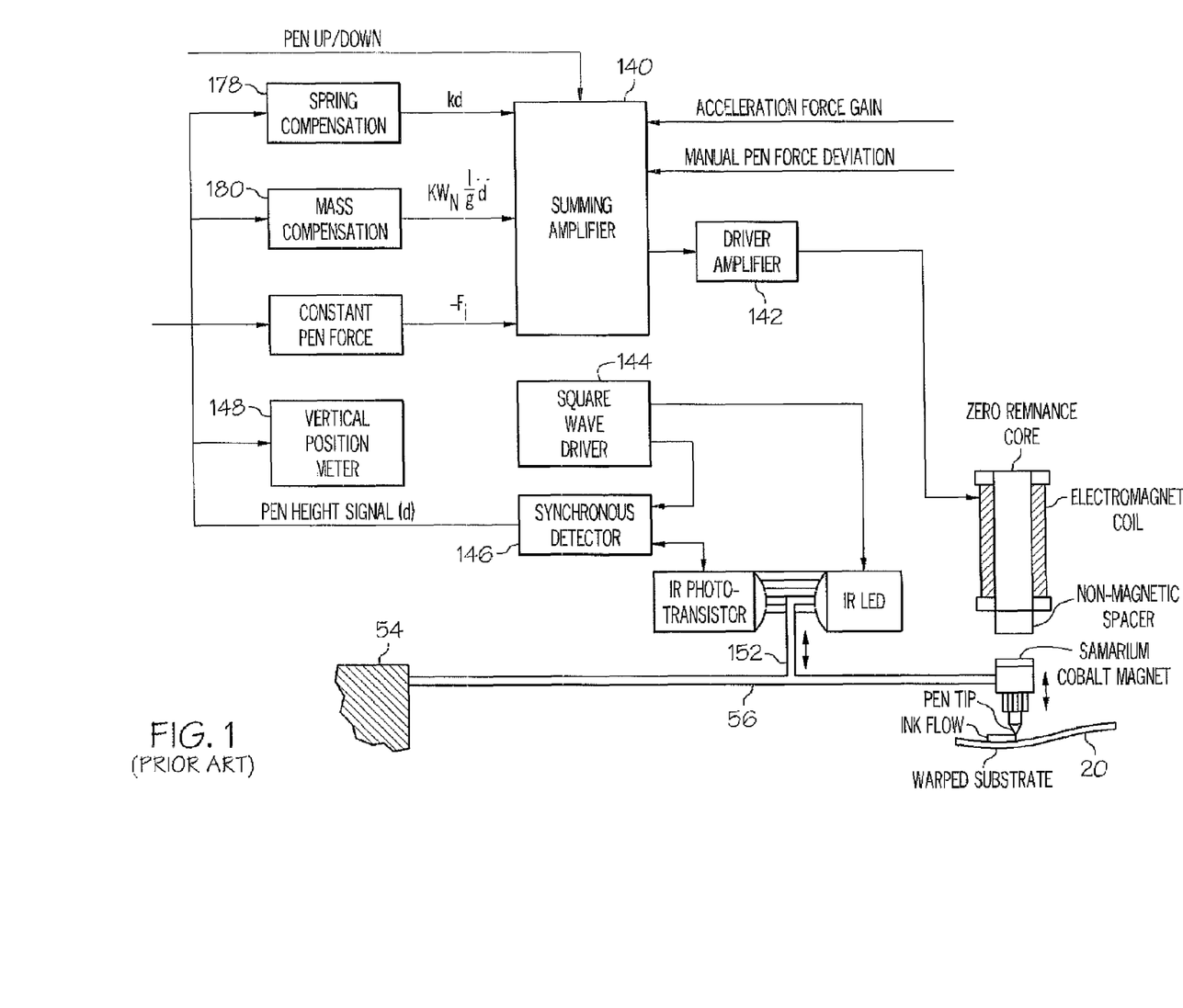
FIG. 1 is a block diagram showing the PRIOR ART pen design.

FIG. 1 shows a PRIOR ART inking system found in U.S. Pat. No. 4,485,387 issued to Drumheller and incorporated herein by reference in its entirety. As seen in FIG. 1, the PRIOR ART shows an optical sensing phototransistor and an electromagnetic coil providing forces to lift the pen tip. FIG. 1 also shows that the inking system includes spring compensation and mass compensation. However, using an electromagnet and applying mechanical feedback forces to the pen tip results in slow mechanical response.

Figure 2:
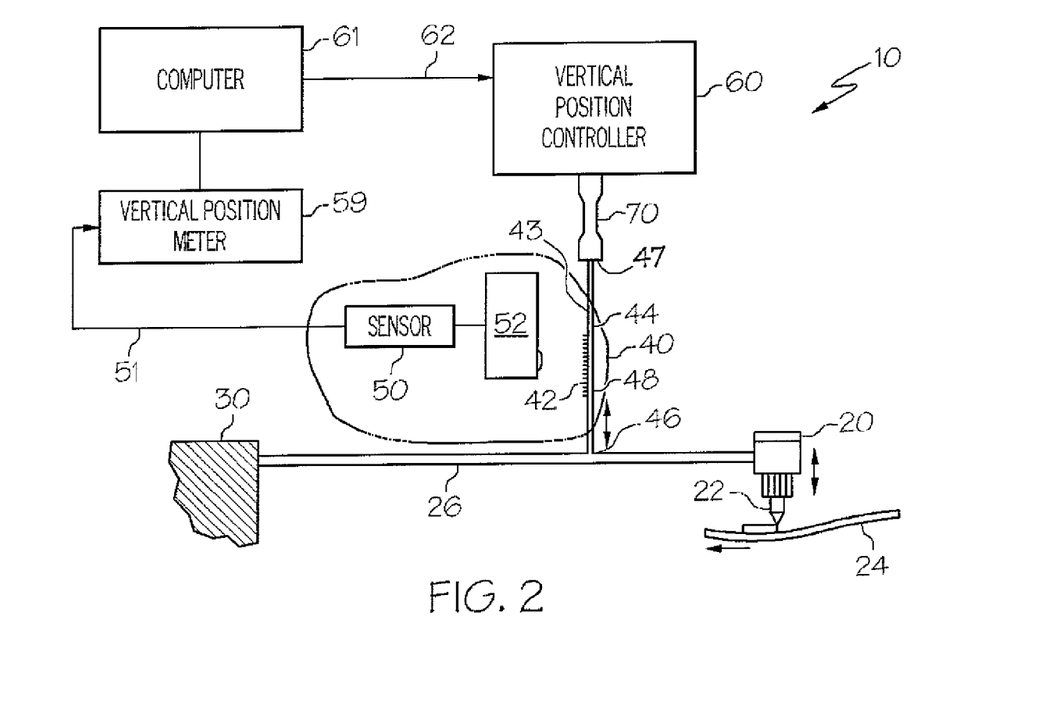
FIG. 2 is a block diagram showing an embodiment of the pen design of the present invention.

Referring now to FIG. 2, an embodiment of the present invention is depicted FIG. 2 depicts an apparatus 10 for precision pen height control comprising a dispensing member 20, a fluid dispensing system 30, a vertical position sensing system 40 having a sensor 50, and a vertical position controller 60. As will be described in more detail below, the vertical position controller imparts vertical motion to the dispensing member and the vertical position sensing system detects the new position of the dispensing member which the sensing system communicates, as necessary, to the vertical position controller.

Figure 3:
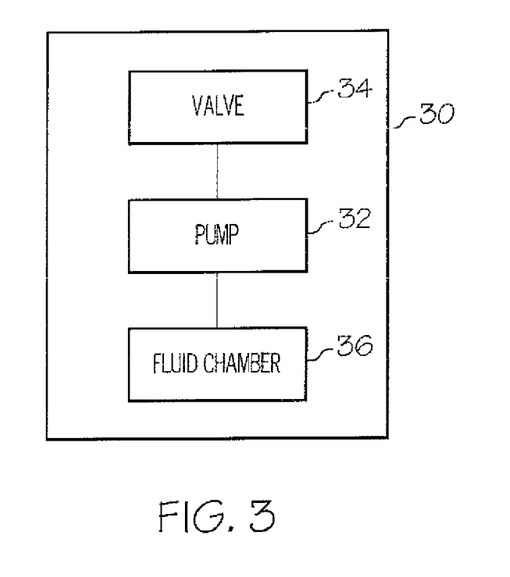
FIG. 3 is a block diagram showing components comprising an embodiment of a fluid dispensing system.

The dispensing member 20 deposits ink or other fluid onto a surface. A portion of the dispensing member 20 of FIG. 2 defines an opening, shown at 22, from which fluid will flow onto the surface 24 of a substrate. The opening 22 is in fluid communication with the tubular member 26 either directly or indirectly through a pump assembly (not depicted). The tubular member 26 is in fluid communication with a fluid dispensing system, shown generally at 30. It should be noted that the tubular member 26 may have a circular cross-section, rectangular cross-section, or any other cross-section which would allow a fluid to flow unrestricted from the fluid dispensing system 30 to the dispensing member. One of ordinary skill in the art will recognize that there are numerous embodiments of the fluid dispensing system 30, one of which is described in detail in U.S. Pat. No. 4,485,387. In some embodiments, the fluid dispensing system comprises a pump 32, a valve 34, and a fluid chamber 36, as depicted in FIG. 3.

It should be noted that based on at least one embodiment in which the substrate is horizontal, the term "vertical" is used herein to describe the position sensing system's position relative to the horizontal substrate upon which material is being dispensed. However, in some environments, such as in a micro-gravity environment, the term "vertical" loses its physical meaning. In such an environment, the position sensing system needs only to be perpendicular to the surface of the substrate, and not necessarily "vertical". At least one embodiments of the present invention is directed towards such an environment.

Referring again to FIG. 2, a vertical position sensing system for determining the vertical position of the dispensing member is shown at 40. The sensing system 40 is shown fixedly engaged to the tubular member. As the dispensing member is raised and lowered to dispense fluid on the surface, the sensing system 40 monitors the vertical position of the dispensing member. One vertical position sensing system is described in U.S. Pat. No. 5,012,090 to Spillman, Jr., the entire contents of which are incorporated herein by reference. Any Moire fringe type optical metrology device could be used as a vertical position sensing system. Moire fringe type optical metrology devices have nanometer resolution and millimeter clearance and are commercially available, such as through MicroE systems (www.microesys.com). The paired gratings of such devices modulate optical throughput in quadrature and provide relative motion signals that are both stable and extremely sensitive. The resolution of vertical height measurements in the present invention are improved over the Drumheller device by a factor of several hundred.

The vertical position sensing system 40 of the present invention includes a diffraction grating 42 having a plurality of lines or markings 43, a vertical support 44, and a sensor 50. As seen in FIG. 2, the vertical position sensing system 40 is constructed and arranged to sense the diffraction grating, and thus the vertical position of the dispensing member.

The diffraction grating 42 is engaged to the vertical support 44. The vertical support 44 comprises a first end 46, engaged to the tubular member, a second end 47, engaged to the vertical position controller, and a substantially straight longitudinal member 48 extending between the first and second ends. As will be described in more detail below, the sensor 50 detects the vertical position of the dispensing member from the diffraction grating engaged to the vertical support and produces a vertical position signal 51 based upon the position of the sensing system.

Figure 4A:
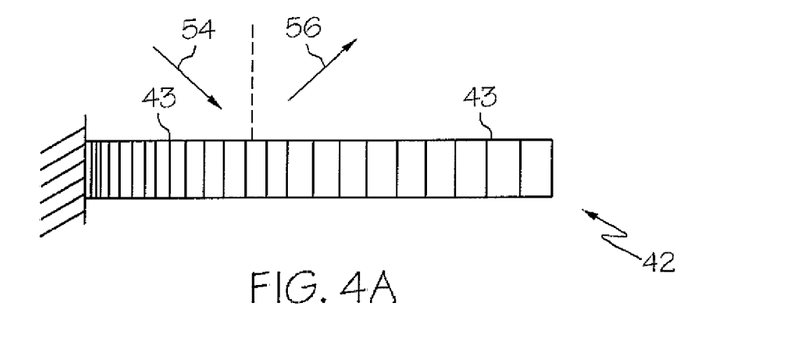
FIG. 4a is a first embodiment of a diffraction grating.
Figure 4B:
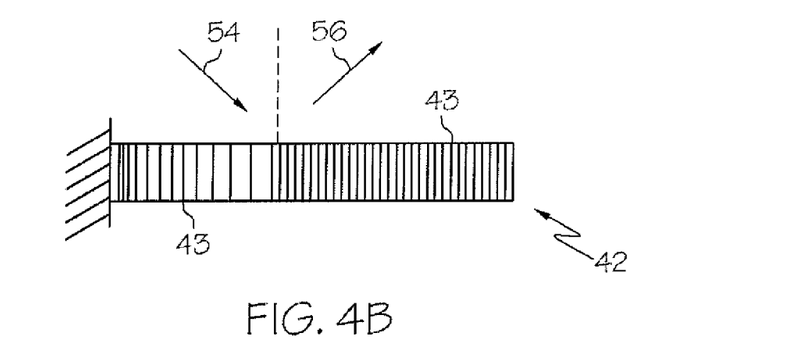
FIG. 4b is a second embodiment of a diffraction grating.
Figure 4C:
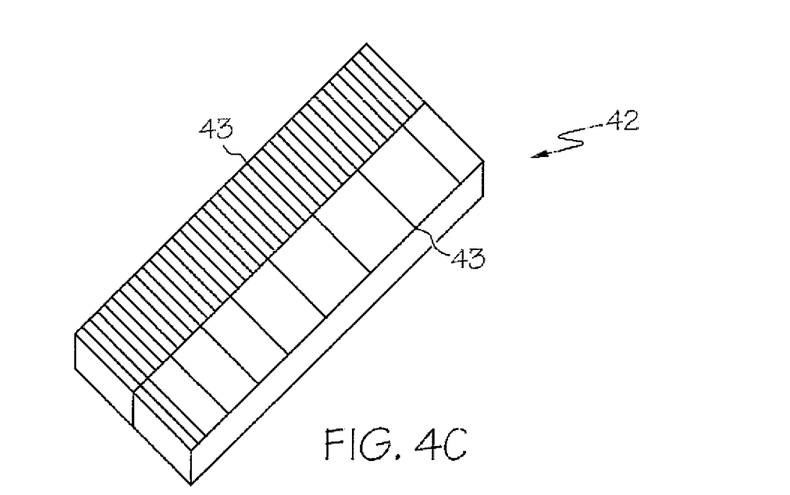
FIG. 4c is a third embodiment of a diffraction grating.

The diffraction grating 42 comprises a plurality of markings 43, as shown in FIGS. 4a-4c, for example. The markings 43 are spaced apart such that light reflected from the grating will have a wavelength which corresponds to the line spacing. As seen in FIG. 4a, the diffraction grating lines are spaced at different intervals. The grating lines may also be spaced at equal intervals. Or, in some as in FIGS. 4b and 4c, the diffraction grating includes lines spaced at different intervals as well as equal intervals. One of ordinary skill will recognize that there are a number of ways to pattern a diffraction grating. As such, FIGS. 4a-4c are meant solely for the purpose of explanation and should not be interpreted in any way as to limit the scope of the invention to the embodiments depicted.

Figure 5:
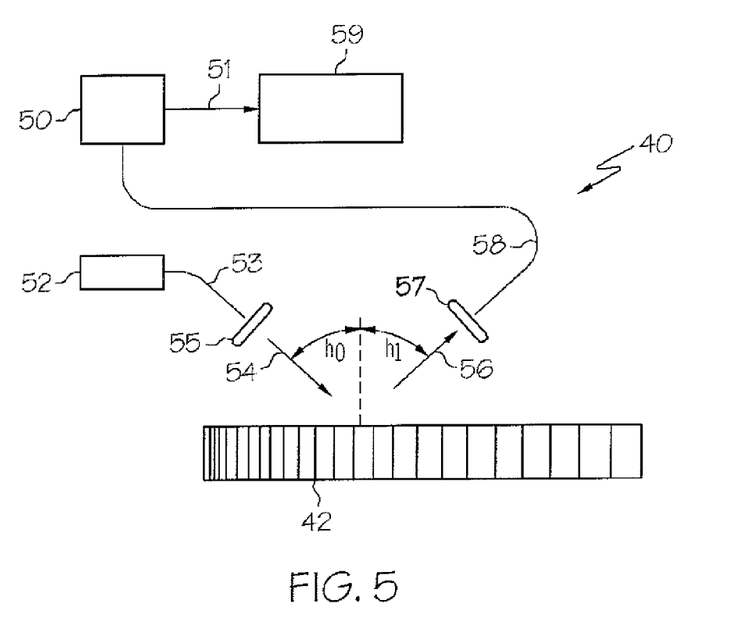
FIG. 5 is a schematic view of a system for detecting grating displacement.

Referring now to an example of a vertical position sensing system, the sensing system includes a light source, transmission media, light, lenses, and a sensor. As best seen in FIG. 5, a light source 52, immediately adjacent a transmission medium 53, transmits light 54. The light exits the transmission medium and passes through a lens 55 onto the diffraction grating. The light source is constructed and arranged to emit light onto the diffraction grating at a first angle $h_0$ such that light 56 is reflected at a second angle $h_1$. The reflected light passes through a lens 57 and a second transmission medium 58 before being received by the sensor, whereby the wavelength of the reflected light is detected. In some embodiments, the sensor is an optical grating sensor. The sensor is constructed and arranged to receive the reflected light 56 and produce at least one electrical signal, the vertical position signal 51, based upon the wavelength of the light received.

Figure 6:
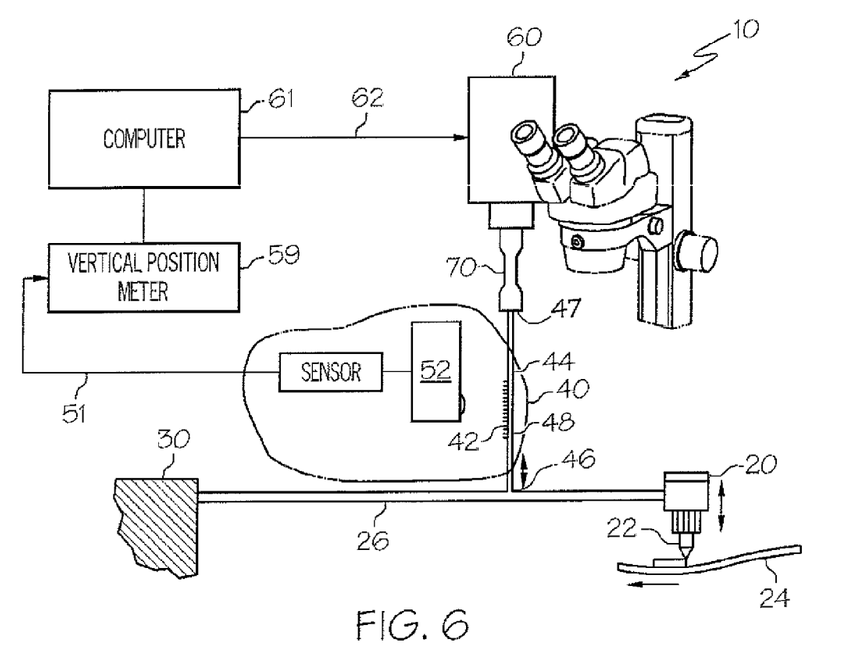
FIG. 6 is a block diagram of a variation of the embodiment of the present invention depicted in FIG. 2.
Figure 7:
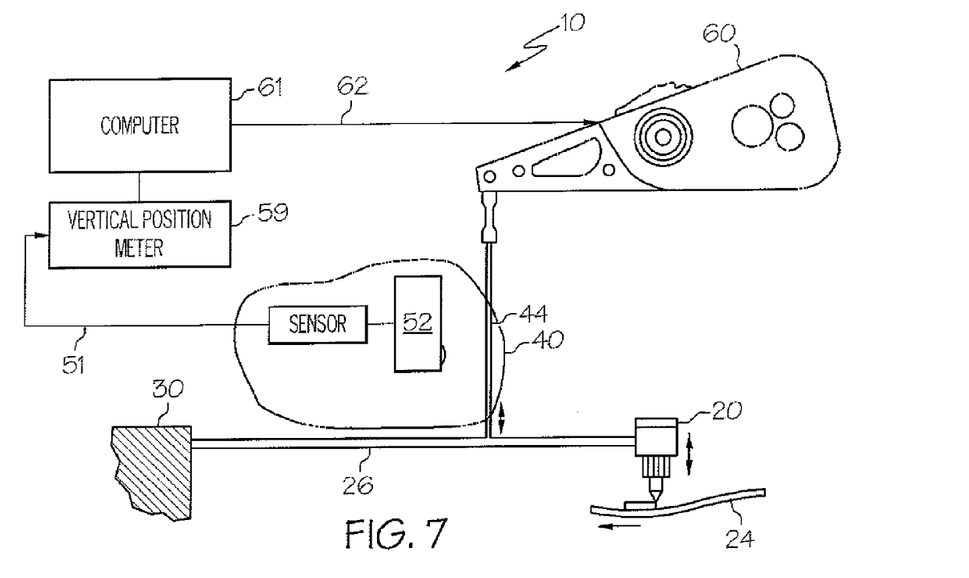
FIG. 7 is a block diagram of a variation of the embodiment of the present invention depicted in FIG. 2.

The apparatus of the present invention may further include a vertical position meter 59 constructed and arranged to receive the vertical position signal produced by the sensor, as seen in FIGS. 2, 6 and 7. The vertical position meter is used to visually monitor the position of the dispensing member without the need for a microscope.

As mentioned above, the precision pen height control apparatus also includes a vertical position controller 60 in operative communication with the vertical position sensing system, as in FIG. 2. The vertical position controller 60 is constructed and arranged to receive a control signal generated at least partially from the vertical position signal generated by the vertical position sensing system. One of ordinary skill will recognize that other variables may also be used to calculate the control signal in addition to the vertical position signal generated by the vertical position sensing system. Also, one of ordinary skill in the art will recognize that there are a number of ways the components of the apparatus can be arranged. For example, the components may be arranged such that the vertical position meter is in operative communication with a computer 61, as shown in FIG. 2. Based upon the signal received by the vertical position meter, as well as any pre-programmed path of the displacement member stored in the memory of the computer 61, the computer outputs a signal 62 to the vertical position controller. Upon receiving the signal 62, the vertical position controller is constructed and arranged to produce and apply vertical forces to the vertical support in response. In at least one embodiment, the vertical position controller is engaged to the second end of the vertical support.

In some embodiments, the vertical position controller comprises an arm 70, as depicted in FIG. 2. At least a portion of the arm 70 is fixedly engaged to the vertical support. Upon receiving the control signal, the vertical position controller imparts vertical movement to the tubular member through the arm and vertical support.

In some embodiments, the vertical position controller 60 is a linear actuator for producing force and motion linearly, an example of which is described in U.S. Pat. No. 6,100,609 to Weber, the entire contents of which are incorporated herein by reference. In at least one embodiment, the linear actuator is a cylindrical voice coil motor, as shown in FIG. 6. FIG. 6 shows a commercially available cylindrical voice coil motor in a "push" mode, a microscope, and an optical grating sensor in a close-coupled configuration. The embodiment in FIG. 6 can be used for machine vision servo control of an X-Y table. In some embodiments, the grating is constructed of a thin adhesive-backed foil approximately 0.4 mm thick and 6.5 mm wide.

Figures 8A, 8B:
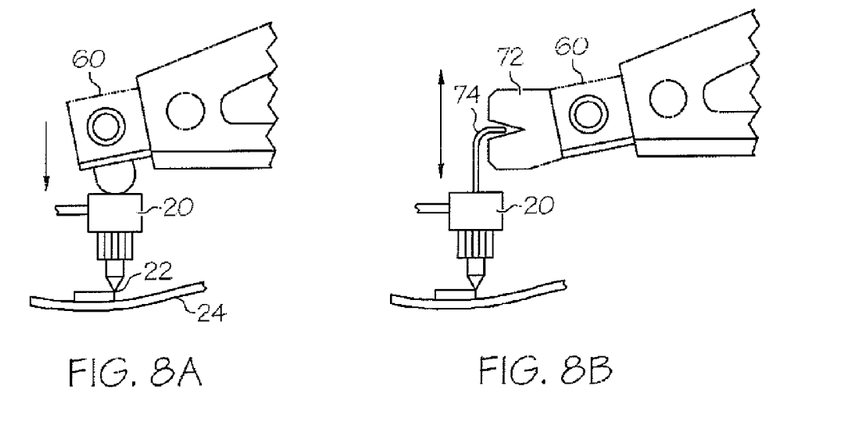
FIG. 8a is a side view of a variation of the embodiment depicted in FIG. 6, showing the voice coil motor connected to the dispensing member.
FIG. 8b is a side view of a variation of the embodiment depicted in FIG. 6, showing the voice coil motor connected to the dispensing member through a clamp.

In at least one embodiment, the linear actuator is the voice coil mechanism from a computer hard drive, as shown in FIG. 7. FIGS. 8a and 8b depict alternate embodiments of the engagement between the voice coil mechanism shown in FIG. 7 and the dispensing member. As seen in FIG. 7, the voice coil mechanism attaches to the arm, which is engaged to the vertical support, which is in turn engaged to the tubular member connected to the dispensing member. In FIGS. 8a and 8b, the voice coil mechanism can be connected directly to the dispensing member, as in FIG. 8a, or the voice coil mechanism can be connected to the dispensing member by a small support, as shown in FIG. 8b.

FIG. 8a shows a direct push-down design with a hard contact. In this case the tubular member 26 supporting the pen assembly is sprung upwards so that without the push-down force, the pen tip naturally floats above the surface 24.

FIG. 8b shows a push-pull linkage where the pen can be either lifted or depressed from its no-force equilibrium position. This would normally be implemented as a zero-backlash linkage. One of ordinary skill in the art will recognize that the configuration in FIG. 8b can also be operated as a push-down linkage, as in FIG. 8a, as long as means are provided to allow the pen to be lifted beyond its natural equilibrium height, thereby allowing tip-cleaning, exchanging of substrates, and additional substrate clearance, for example. In this case, a small amount of clearance or "backlash" in the linkage (~1 mm) would be appropriate. As shown in FIG. 8b, the small support can have a clamp-like device 72, engaged to the vertical position controller, and a support 74 which fixedly engages the clamp-like device 72 to the dispensing member.

Figure 9:
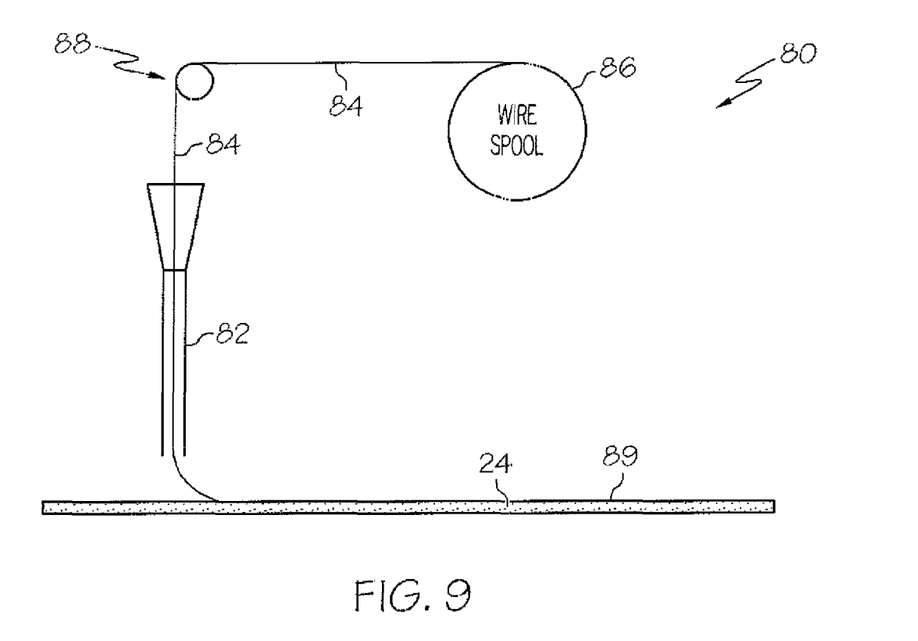
FIG. 9 is a schematic view of an embodiment of a wire dispensing mechanism.

In at least one embodiment, the micro-extruder further comprises a wire dispensing/guiding mechanism. FIG. 9 illustrates an embodiment of a wire dispensing/guiding mechanism, shown generally at 80. The hollow needle guide 82 guides the wire 84 from a wire spool 86 over a guide pin 88 to the surface 24 of the substrate. In order for the mechanism 80 to handle small diameter wire without breaking the wire, some embodiments of the present invention provide the wire spool 86 with low-function bearings. In at least one embodiment, an active, computer-controlled feed system is provided which senses the wire tensions and adjusts accordingly.

The wire 84 can be held to the surface 24 of the substrate by a number of methods. In at least one embodiment, the wire can be held to the surface via an adhesive 89, such as a pressure sensitive or UV-curable adhesive, previously applied to the surface. If a UV-curable adhesive is used, it may be co-dispensed with the wire or applied through a separate dispensing tip adjacent the wire dispensing tip and cured via a suitable light source directed at the surface by fiber optics or other suitable light guide. Thus, the micro-extruder can be depositing an adhesive while also dispensing wire onto the adhesive, thereby securing the wire to a medical device. For example, a nitinol wire can be bonded to an ePTFE leaflet. The wire is applied to the surface by lightly touching the wire to the surface at a desired location, where it is held in place by the pressure sensitive or UV-curable adhesive, and then lifting the tip and moving to the next desired location and repeating the attachment sequence.

Figure 10:
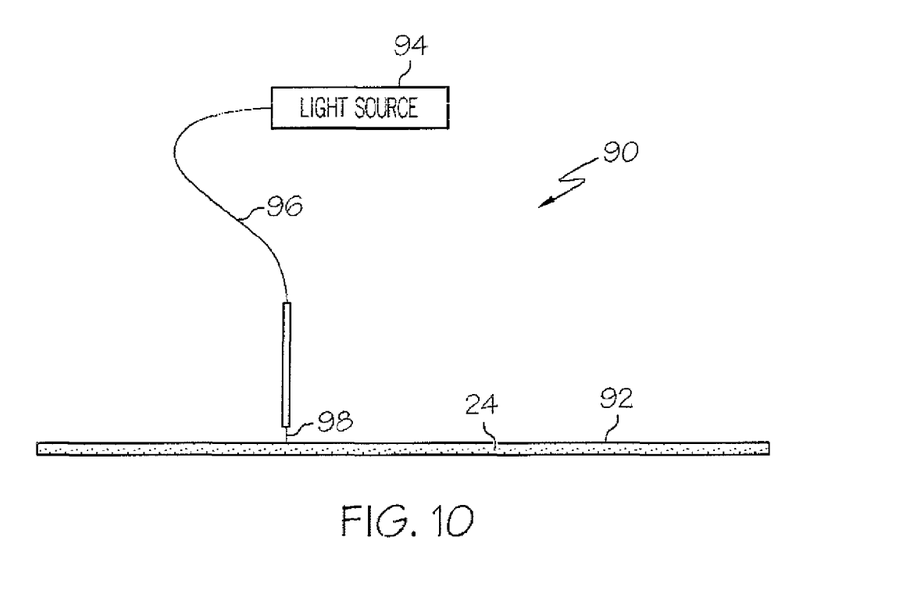
FIG. 10 is a schematic view of an embodiment of a curing mechanism.

In at least one embodiment, the micro-extruder further comprises a curing mechanism, thereby allowing extrusion and curing to occur nearly simultaneously. FIG. 10 illustrates an embodiment of a curing mechanism, shown generally at 90. An adhesive pattern can be formed by first coating the surface 24 with an uncured light-curable material 92. Then a curing light from a light source 94, of an appropriate wavelength, is directed at the surface via a fiber optic or equivalent light guide 96. The curing light may form a single narrow beam 98. The width of the beam on the surface is controlled by selecting an optical fiber with the desired numerical aperture or using a simple lens. As the light is moved across the surface, the adhesive is cured only where the light is directed. Uncured adhesive is removed with an appropriate solvent, leaving only the cured pattern.

Figure 11:
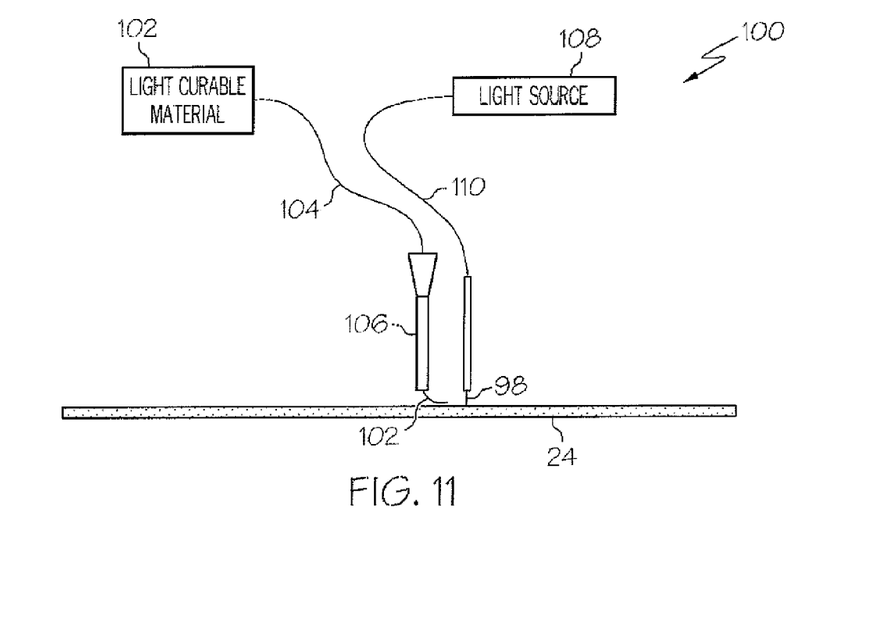
FIG. 11 is a schematic view of an embodiment of fluid dispensing mechanism and a curing mechanism.

In some embodiments, the micro-extruder includes both a fluid dispensing mechanism for depositing, for example, a light-curable adhesive, as well as an arrangement of optical fibers or other suitable light guides to direct light of the appropriate curing wavelength at the surface just after the adhesive has been dispensed. FIG. 11 depicts such an embodiment, shown generally at 100. In FIG. 10, after a light curable material 102 is delivered to a surface of a substrate via a delivery tube 104 and dispensing tip 106, a light source 108 directs a light beam through the fiber optic material 110 and onto the light-curable material 102. The fiber optic material may be attached directly to the dispensing tip for large configurations or be held separately if a very small, low-mass pen tip is used. If immediate curing of the curable material is not needed, the entire pattern can be applied first and then the entire surface exposed to the curing wavelength from an appropriate light source.

Figure 12:
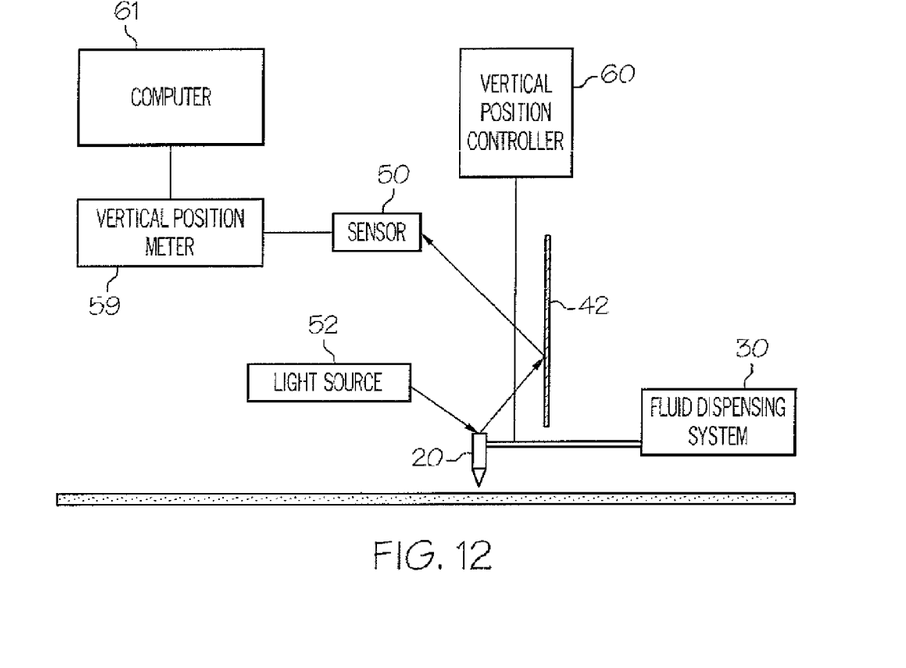
FIG. 12 is a schematic view of a variation of the embodiment of the present invention depicted in FIG. 2.

For very small, very low mass dispensing pens, a diffraction grating may be too large or have a mass large enough to adversely affect the response frequency of the tip control system if directly attached. Thus, in some embodiments, the diffraction grating is mounted to a fixed surface adjacent to the pen rather than being engaged to the vertical support. FIG. 12 shows such an embodiment, with light being directed to the grating after first being reflected from the pen or pen-support member.

Figure 13:
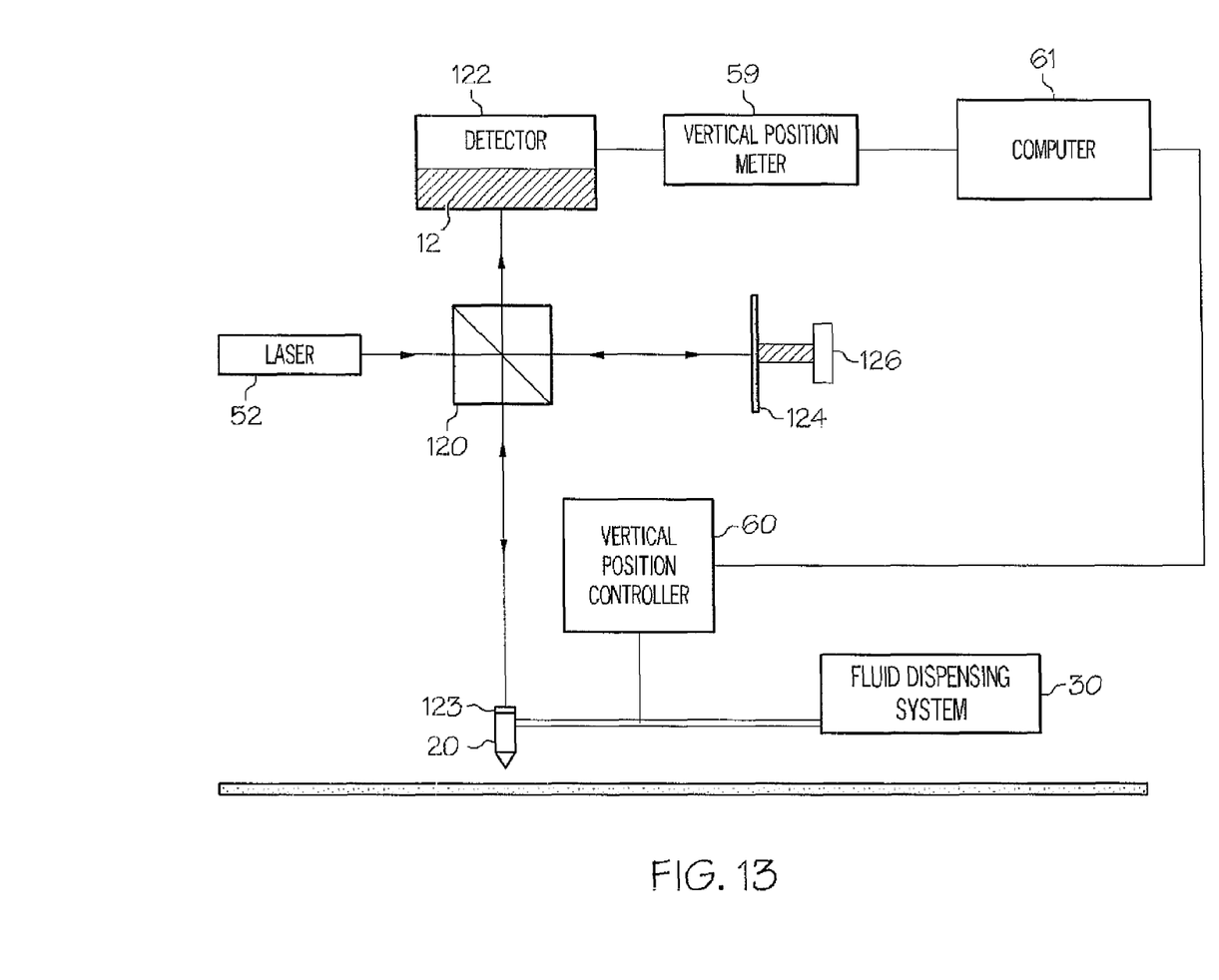
FIG. 13 is a schematic view of a variation of the embodiment of the present invention depicted in FIG. 2.

In at least one embodiment, the diffraction grating is eliminated. For very small, very low mass dispensing pens the grating can be eliminated entirely by using an interferometer-based position sensing system, as illustrated in FIG. 13. One of ordinary skill in the art will recognize that the system includes a standard Michelson interferometer. Michelson interferometers are described in U.S. Pat. Nos. 4,571,080, 4,575,246, and 5,341,207, the entire contents of each being incorporated herein by reference. This system uses light reflected from the pen or pen support mechanism and therefore adds no mass to the pen/support mechanism. Light from a laser or other suitable light source 52 is split into two beams by beam splitter 120. The first beam is routed directly toward a detector 122 while the second part of the split beam is reflected from the dispensing member 20 by mirrored or reflective surface 123. The two beams are then recombined at the surface of the detector 122. The interferometer of FIG. 13 further includes a mirror or reflective surface 124, moveable via the adjustable path length reference arm 126. Because the two beams travel different distances, their wavelengths will be out of phase and an interference pattern 124 is formed at the detector. This interference pattern is very sensitive to the pen position and will change as the pen moves. The pattern can be sensed in a variety of techniques familiar to those skilled in the art of interferometry. One sensing mechanism is made by applying the interference pattern to a linear charge coupled device (CCD) with an appropriately arrayed number of elements having the desired spacing configuration. Another mechanism uses only a few detector elements (e.g. photodiodes) to count the fringes in a manner similar to a stepper motor equipped with an optical encoder.

The above disclosure is intended to be illustrative and not exhaustive. This description will suggest many variations and alternatives to one of ordinary skill in this art. The various elements shown in the individual figures and described above may be combined or modified for combination as desired. All these alternatives and variations are intended to be included within the scope of the claims where the term "comprising" means "including, but not limited to". Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. An apparatus for precision pen height control, the apparatus comprising:
   a dispensing member, a portion of the dispensing member defining an opening;
   a fluid dispensing system, the fluid dispensing system being in fluid communication with the opening by a tubular member;
   a vertical position sensing system fixedly engaged to the tubular member, the vertical position sensing system comprising a diffraction grating and a sensor, the sensor being positioned adjacent the diffraction grating, the sensor being constructed and arranged to sense the diffraction grating, a vertical support being engaged to the tubular member, the sensor being further constructed and arranged to produce a vertical position signal based upon the position of the vertical support; and
   a vertical position controller fixedly engaged to the tubular member by the vertical support of the vertical position sensing system, the vertical position controller being enraged to the vertical position sensing system, the vertical position controller constructed and arranged to receive a control signal generated at least partially from the vertical position signal, the vertical position controller further constructed and arranged to produce and apply vertical forces to the vertical support in response to the control signal.

2. The apparatus of claim 1, wherein the diffraction grating is engaged to the vertical support.

3. The apparatus of claim 1, wherein the fluid dispensing system comprises a fluid chamber, a valve, and a pump.

4. The apparatus of claim 1, wherein the vertical support comprises a first end, a second end, and a substantially straight longitudinal member extending therebetween, and wherein the first end is engaged to the tubular member and the second end is engaged to the vertical position controller.

5. The apparatus of claim 1, wherein the diffraction grating comprises a plurality of lines, the plurality of lines being spaced apart such that a light reflected from the grating will have a wavelength which corresponds to the line spacing.

6. The apparatus of claim 5, wherein the vertical position sensing system comprises a light source, the light source being adjacent a transmission medium, the transmission medium being adjacent a lens, the lens being positioned adjacent the diffraction grating, the light source constructed and arranged to emit light through the transmission medium and lens onto the diffraction grating such that light is reflected, and wherein the sensor comprises a detector, the detector constructed and arranged to receive the reflected light and produce at least one electrical signal based upon the wavelength of the light received.

7. The apparatus of claim 6, wherein the vertical position controller comprises an arm, at least a portion of the arm being fixedly engaged to the vertical support, and wherein upon receiving the control signal the vertical position controller imparts vertical movement to the tubular member through the arm and vertical support.

8. The apparatus of claim 1, wherein the vertical position controller is a linear actuator.

9. The apparatus of claim 8, wherein the linear actuator is a voice coil motor.

10. The apparatus of claim 1, wherein the sensor is an optical grating sensor.

11. The apparatus of claim 1, wherein a curing mechanism is engaged to the dispensing member.

12. The apparatus of claim 1, wherein a wire dispensing mechanism is engaged to the dispensing member.

13. An apparatus for precision pen height control, the apparatus comprising:
    a dispensing member, a portion of the dispensing member defining an opening;
    a fluid dispensing system, the fluid dispensing system being in fluid communication with the opening by a tubular member;
    a vertical position sensing system fixedly engaged to the tubular member, the vertical position sensing system comprising a diffraction grating and an optical grating sensor, the optical grating sensor being positioned adjacent the diffraction grating, the optical grating sensor being constructed and arranged to sense the diffraction grating, the diffraction grating being engaged to a vertical support, the vertical support being engaged to the tubular member, the optical grating sensor being further constructed and arranged to produce a vertical position signal based upon the position of the vertical support; and
    a linear actuator fixedly engaged to the tubular member by the vertical support of the vertical position sensing system, the linear actuator being engaged to the vertical position sensing system, the linear actuator constructed and arranged to receive a control signal generated at least partially from the vertical position signal, the linear actuator constructed and arranged to produce and apply vertical forces to the vertical support in response to the control signal.

14. An apparatus for precision pen height control, the apparatus comprising:
    a dispensing member, a portion of the dispensing member defining an opening;
    a fluid dispensing system, the fluid dispensing system being: in fluid communication with the opening by a tubular member;
    a vertical position sensing system fixedly engaged to the tubular member, the vertical position sensing system comprising a diffraction grating and a sensor, the sensor being positioned adjacent the diffraction grating, the sensor being constructed and arranged to sense the diffraction grating, the diffraction grating being engaged to a vertical support, the vertical support being engaged to the tubular member, the sensor being further constructed and arranged to produce a vertical position signal based upon the position of the vertical support; and
    a voice coil motor fixedly engaged to the tubular member by the vertical support of the vertical position sensing system, the voice coil motor being engaged to the vertical position sensing system, the voice coil motor constructed and arranged to receive a control signal generated at least partially from the vertical position signal, the voice coil motor constructed and arranged to produce and apply vertical forces to the vertical support in response to the control signal.

* * * * *